(12) United States Patent
Rubin (10) Patent No.: US 6,929,762 B2
(45) Date of Patent: Aug. 16, 2005

(54) METHOD OF REDUCING PATTERN DISTORTIONS DURING IMPRINT LITHOGRAPHY PROCESSES

(75) Inventor: Daniel I. Rubin, Atherton, CA (US)

(73) Assignee: Molecular Imprints, Inc., Austin, TX (US)

( * ) Notice: Subject to any disclaimer, the term of this patent is extended or adjusted under 35 U.S.C. 154(b) by 377 days.

(21) Appl. No.: 10/293,223

(22) Filed: Nov. 13, 2002

(65) Prior Publication Data

US 2004/0089979 A1 May 13, 2004

(51) Int. Cl.[7] .......................... B29C 33/40; B29C 35/08; B29C 43/02; B29C 59/02
(52) U.S. Cl. ...................... 264/40.1; 264/293; 264/320; 264/322; 264/345; 264/496
(58) Field of Search ................................ 264/40.1, 293, 264/320, 322, 345, 496

(56) References Cited

U.S. PATENT DOCUMENTS

| | | | |
|---|---|---|---|
| 3,527,062 A | 9/1970 | Belinski et al. | |
| 3,783,520 A | 1/1974 | King | |
| 3,807,027 A | 4/1974 | Heisler | |
| 3,807,029 A | 4/1974 | Troeger | |

(Continued)

FOREIGN PATENT DOCUMENTS

| | | |
|---|---|---|
| DE | 2800476 A1 | 7/1978 |
| DE | 19648844 C1 | 9/1997 |
| EP | 244884 A1 | 3/1987 |
| EP | 733455 A2 | 9/1996 |

(Continued)

OTHER PUBLICATIONS

Abstract of Japanese Patent 02–24848, Jan. 26, 1990.
Abstract of Japanese Patent 02–92603, Aug. 12, 2004.
Abstract of Japanese Patent 55–88332, Apr. 14, 2004.
Abstract of Japanese Patent 57–7931, Apr. 14, 2004.

(Continued)

Primary Examiner—Leo B. Tentoni
(74) Attorney, Agent, or Firm—Kenneth C. Brooks (57) ABSTRACT

The present invention is directed to a method of reducing distortions in a pattern disposed on a layer of a substrate, defining a recorded pattern, employing a mold having the pattern recorded therein, defining an original pattern. The method includes, defining a region on the layer in which to produce the recorded pattern. Relative extenuative variations between the substrate and the mold are created to ensure that the original pattern defines an area coextensive with the region. Thereafter, the recorded pattern is formed in the region. The relative extenuative variations are created by heating or cooling of the substrate so that the region defines an area that is slightly smaller/larger than the area of the original pattern. Then compression/tensile forces are applied to the mold to provide the recorded pattern with an area coextensive with the area of the region.

20 Claims, 6 Drawing Sheets

U.S. PATENT DOCUMENTS

| | | |
|---|---|---|
| 3,811,665 A | 5/1974 | Seelig |
| 4,062,600 A | 12/1977 | Wyse |
| 4,070,116 A | 1/1978 | Frosch et al. |
| 4,098,001 A | 7/1978 | Watson |
| 4,119,688 A | 10/1978 | Hiraoka |
| 4,155,169 A | 5/1979 | Drake et al. |
| 4,201,800 A | 5/1980 | Alcorn et al. |
| 4,202,107 A | 5/1980 | Watson |
| 4,256,829 A * | 3/1981 | Daniel ............... 438/542 |
| 4,267,212 A | 5/1981 | Sakawaki |
| 4,326,805 A | 4/1982 | Feldman et al. |
| 4,337,579 A | 7/1982 | De Fazio |
| 4,355,469 A | 10/1982 | Nevins et al. |
| 4,414,750 A | 11/1983 | De Fazio |
| 4,426,247 A | 1/1984 | Tamamura et al. |
| 4,440,804 A | 4/1984 | Milgram |
| 4,451,507 A | 5/1984 | Beltz et al. |
| 4,507,331 A | 3/1985 | Hiraoka |
| 4,544,572 A | 10/1985 | Sandvig et al. |
| 4,552,832 A | 11/1985 | Blume et al. |
| 4,552,833 A | 11/1985 | Ito et al. |
| 4,600,309 A | 7/1986 | Fay |
| 4,610,442 A | 9/1986 | Oku et al. |
| 4,657,845 A | 4/1987 | Frechet et al. |
| 4,692,205 A | 9/1987 | Sachdev et al. |
| 4,694,703 A | 9/1987 | Routson |
| 4,707,218 A | 11/1987 | Giammarco et al. |
| 4,724,222 A | 2/1988 | Feldman |
| 4,731,155 A | 3/1988 | Napoli et al. |
| 4,737,425 A | 4/1988 | Lin et al. |
| 4,763,886 A | 8/1988 | Takei |
| 4,772,878 A | 9/1988 | Kane |
| 4,808,511 A | 2/1989 | Holmes |
| 4,826,943 A | 5/1989 | Ito et al. |
| 4,846,931 A | 7/1989 | Gmitter et al. |
| 4,848,179 A | 7/1989 | Ubhayakar |
| 4,848,911 A | 7/1989 | Uchida et al. |
| 4,857,477 A | 8/1989 | Kanamori |
| 4,883,561 A | 11/1989 | Gmitter et al. |
| 4,887,283 A | 12/1989 | Hosno |
| 4,891,303 A | 1/1990 | Garza et al. |
| 4,908,298 A | 3/1990 | Hefferon et al. |
| 4,909,151 A | 3/1990 | Fukui et al. |
| 4,919,748 A | 4/1990 | Bredbenner et al. |
| 4,921,778 A | 5/1990 | Thackeray et al. |
| 4,929,083 A | 5/1990 | Brunner |
| 4,931,351 A | 6/1990 | McColgin et al. |
| 4,959,252 A | 9/1990 | Bonnebat et al. |
| 4,964,145 A | 10/1990 | Maldonado |
| 4,964,945 A | 10/1990 | Calhoun et al. |
| 4,976,818 A | 12/1990 | Hashimoto et al. |
| 4,980,316 A | 12/1990 | Huebner |
| 4,999,280 A | 3/1991 | Hiraoka |
| 5,053,318 A | 10/1991 | Gulla et al. |
| 5,063,321 A | 11/1991 | Carter |
| 5,071,694 A | 12/1991 | Uekita et al. |
| 5,072,126 A | 12/1991 | Progler |
| 5,073,230 A | 12/1991 | Maracas et al. |
| 5,074,667 A | 12/1991 | Miyatake |
| 5,108,875 A | 4/1992 | Thackeray et al. |
| 5,110,514 A | 5/1992 | Soane |
| 5,126,006 A | 6/1992 | Cronin et al. |
| 5,148,036 A | 9/1992 | Matsugu et al. |
| 5,148,037 A | 9/1992 | Suda et al. |
| 5,151,754 A | 9/1992 | Ishibashi et al. |
| 5,155,749 A | 10/1992 | DiMilia et al. |
| 5,169,494 A | 12/1992 | Hashimoto et al. |
| 5,171,490 A | 12/1992 | Fudim |
| 5,173,393 A | 12/1992 | Sezi et al. |
| 5,179,863 A | 1/1993 | Uchida et al. |
| 5,198,326 A | 3/1993 | Hashimoto et al. |
| 5,204,739 A | 4/1993 | Domenicali |
| 5,206,983 A | 5/1993 | Guckel et al. |
| 5,212,147 A | 5/1993 | Sheats |
| 5,218,193 A | 6/1993 | Miyatake |
| 5,234,793 A | 8/1993 | Sebald et al. |
| 5,240,550 A | 8/1993 | Boehnke et al. |
| 5,240,878 A | 8/1993 | Fitzsimmons et al. |
| 5,242,711 A | 9/1993 | DeNatale et al. |
| 5,244,818 A | 9/1993 | Jokerst et al. |
| 5,259,926 A | 11/1993 | Kuwabara et al. |
| 5,270,984 A | 12/1993 | Mine |
| 5,277,749 A | 1/1994 | Griffith et al. |
| 5,314,772 A | 5/1994 | Kozicki et al. |
| 5,318,870 A | 6/1994 | Hartney |
| 5,324,683 A | 6/1994 | Fitch et al. |
| 5,328,810 A | 7/1994 | Lowrey et al. |
| 5,330,881 A | 7/1994 | Sidman et al. |
| 5,348,616 A | 9/1994 | Hartman et al. |
| 5,355,219 A | 10/1994 | Araki et al. |
| 5,357,122 A | 10/1994 | Okubora et al. |
| 5,362,606 A | 11/1994 | Hartney et al. |
| 5,366,851 A | 11/1994 | Novembre |
| 5,374,454 A | 12/1994 | Bickford et al. |
| 5,376,810 A | 12/1994 | Hoenk et al. |
| 5,380,474 A | 1/1995 | Rye et al. |
| 5,392,123 A | 2/1995 | Marcus et al. |
| 5,414,514 A | 5/1995 | Smith et al. |
| 5,417,802 A | 5/1995 | Obeng |
| 5,421,981 A | 6/1995 | Leader et al. |
| 5,422,295 A | 6/1995 | Choi et al. |
| 5,424,549 A | 6/1995 | Feldman |
| 5,425,848 A | 6/1995 | Haisma et al. |
| 5,425,964 A | 6/1995 | Southwell et al. |
| 5,431,777 A | 7/1995 | Austin |
| 5,439,766 A | 8/1995 | Day et al. |
| 5,452,090 A | 9/1995 | Progler et al. |
| 5,453,157 A | 9/1995 | Jeng |
| 5,458,520 A | 10/1995 | DeMercurio et al. |
| 5,468,542 A | 11/1995 | Crouch |
| 5,480,047 A | 1/1996 | Tanigawa et al. |
| 5,504,793 A | 4/1996 | Chen |
| 5,507,411 A | 4/1996 | Peckels |
| 5,508,527 A | 4/1996 | Kuroda et al. |
| 5,512,131 A | 4/1996 | Kumar et al. |
| 5,515,167 A | 5/1996 | Ledger et al. |
| 5,523,878 A | 6/1996 | Wallace et al. |
| 5,527,662 A | 6/1996 | Hashimoto et al. |
| 5,545,367 A | 8/1996 | Bae et al. |
| 5,563,702 A | 10/1996 | Emery et al. |
| 5,566,584 A | 10/1996 | Briganti |
| 5,633,505 A | 5/1997 | Chung et al. |
| 5,654,238 A | 8/1997 | Cronin et al. |
| 5,669,303 A | 9/1997 | Maracas et al. |
| 5,670,415 A | 9/1997 | Rust |
| 5,700,626 A | 12/1997 | Lee et al. |
| 5,723,176 A | 3/1998 | Keyworth et al. |
| 5,724,145 A | 3/1998 | Kondo et al. |
| 5,725,788 A | 3/1998 | Maracas et al. |
| 5,726,548 A | 3/1998 | Chiba et al. |
| 5,731,981 A | 3/1998 | Simard |
| 5,736,424 A | 4/1998 | Prybyla et al. |
| 5,737,064 A | 4/1998 | Inoue et al. |
| 5,743,998 A | 4/1998 | Park |
| 5,747,102 A | 5/1998 | Smith et al. |
| 5,753,014 A | 5/1998 | Van Rijn |
| 5,760,500 A | 6/1998 | Kondo et al. |
| 5,772,905 A | 6/1998 | Chou |
| 5,776,748 A | 7/1998 | Singhvi et al. |
| 5,779,799 A | 7/1998 | Davis |
| 5,785,918 A | 7/1998 | Hull |

| Patent No. | Date | Inventor |
|---|---|---|
| 5,802,914 A | 9/1998 | Fassler et al. |
| 5,804,474 A | 9/1998 | Sakaki et al. |
| 5,808,742 A | 9/1998 | Everett et al. |
| 5,825,482 A | 10/1998 | Nikooahad et al. |
| 5,855,686 A | 1/1999 | Rust |
| 5,876,550 A | 3/1999 | Feygin et al. |
| 5,877,036 A | 3/1999 | Kawai |
| 5,877,861 A | 3/1999 | Ausschnitt et al. |
| 5,884,292 A | 3/1999 | Baker et al. |
| 5,888,650 A | 3/1999 | Calhoun et al. |
| 5,895,263 A | 4/1999 | Carter et al. |
| 5,900,160 A | 5/1999 | Whitesides et al. |
| 5,907,782 A | 5/1999 | Wu |
| 5,912,049 A | 6/1999 | Shirley |
| 5,926,690 A | 7/1999 | Toprac et al. |
| 5,937,758 A | 8/1999 | Maracas et al. |
| 5,942,871 A | 8/1999 | Lee |
| 5,948,219 A | 9/1999 | Rohner |
| 5,948,470 A | 9/1999 | Harrison et al. |
| 5,948,570 A | 9/1999 | Kornblut et al. |
| 5,952,127 A | 9/1999 | Yamanaka |
| 5,988,859 A | 11/1999 | Kirk |
| 6,033,977 A | 3/2000 | Gutsche et al. |
| 6,035,805 A | 3/2000 | Rust |
| 6,036,055 A | 3/2000 | Mogadam et al. |
| 6,038,280 A | 3/2000 | Rossiger et al. |
| 6,039,897 A | 3/2000 | Lochhead et al. |
| 6,046,056 A | 4/2000 | Parce et al. |
| 6,051,345 A | 4/2000 | Huang |
| 6,074,827 A | 6/2000 | Nelson et al. |
| 6,081,334 A | 6/2000 | Brimbergen et al. |
| 6,088,103 A | 7/2000 | Everett et al. |
| 6,091,485 A | 7/2000 | Li et al. |
| 6,096,655 A | 8/2000 | Lee et al. |
| 6,117,708 A | 9/2000 | Wensel |
| 6,125,183 A | 9/2000 | Jiawook et al. |
| 6,128,085 A | 10/2000 | Buermann et al. |
| 6,133,576 A | 10/2000 | Shafer et al. |
| 6,137,562 A | 10/2000 | Masuyuki et al. |
| 6,143,412 A | 11/2000 | Schueller et al. |
| 6,150,231 A | 11/2000 | Muller et al. |
| 6,150,680 A | 11/2000 | Eastman et al. |
| 6,168,845 B1 | 1/2001 | Fontana, Jr. et al. |
| 6,180,239 B1 | 1/2001 | Whitesides et al. |
| 6,182,042 B1 | 1/2001 | Peevers |
| 6,188,150 B1 | 2/2001 | Spence |
| 6,204,922 B1 | 3/2001 | Chalmers |
| 6,218,316 B1 | 4/2001 | Marsh |
| 6,234,379 B1 | 5/2001 | Donges |
| 6,245,213 B1 | 6/2001 | Olsson et al. |
| 6,245,581 B1 | 6/2001 | Bonser et al. |
| 6,274,294 B1 | 8/2001 | Hines |
| 6,309,580 B1 | 10/2001 | Chou |
| 6,316,290 B1 | 11/2001 | Wensel |
| 6,326,627 B1 | 12/2001 | Putvinski et al. |
| 6,329,256 B1 | 12/2001 | Ibok |
| 6,334,960 B1 | 1/2002 | Willson et al. |
| 6,337,262 B1 | 1/2002 | Pradeep et al. |
| 6,355,198 B1 | 3/2002 | Kim et al. |
| 6,361,831 B1 | 3/2002 | Sato et al. |
| 6,383,928 B1 | 5/2002 | Eissa |
| 6,387,783 B1 | 5/2002 | Furukawa et al. |
| 6,387,787 B1 | 5/2002 | Mancini et al. |
| 6,388,253 B1 | 5/2002 | Su |
| 6,391,217 B2 | 5/2002 | Schaffer et al. |
| 6,391,798 B1 | 5/2002 | DeFelice et al. |
| 6,407,340 B1 | 6/2002 | Wikstrom et al. |
| 6,411,010 B1 | 6/2002 | Suzuki et al. |
| 6,420,892 B1 | 7/2002 | Krivy et al. |
| 6,423,207 B1 | 7/2002 | Heidari et al. |
| 6,437,891 B1 | 8/2002 | Chandrasekhar et al. |
| 6,447,919 B1 | 9/2002 | Brown et al. |
| 6,455,411 B1 | 9/2002 | Jiang et al. |
| 6,467,761 B1 | 10/2002 | Amatucci et al. |
| 6,482,742 B1 | 11/2002 | Chou |
| 6,489,068 B1 | 12/2002 | Kye |
| 6,495,624 B1 | 12/2002 | Brown |
| 6,514,672 B2 | 2/2003 | Tsai et al. |
| 6,517,977 B2 | 2/2003 | Resnick et al. |
| 6,518,168 B1 | 2/2003 | Clem et al. |
| 6,521,324 B1 | 2/2003 | Debe et al. |
| 6,522,411 B1 | 2/2003 | Moon et al. |
| 6,534,418 B1 | 3/2003 | Plat et al. |
| 6,539,286 B1 | 3/2003 | Jiang |
| 6,541,356 B2 | 4/2003 | Fogel |
| 6,541,360 B1 | 4/2003 | Plat et al. |
| 6,561,706 B2 | 5/2003 | Singh et al. |
| 6,565,928 B2 | 5/2003 | Sakamoto et al. |
| 6,580,505 B1 | 6/2003 | Bareket |
| 6,588,632 B1 | 7/2003 | Nicol |
| 6,600,969 B2 | 7/2003 | Sudolcan et al. |
| 6,632,742 B2 | 10/2003 | Yang et al. |
| 6,633,391 B1 | 10/2003 | Oluseyi et al. |
| 6,635,581 B2 | 10/2003 | Wong |
| 6,646,662 B1 | 11/2003 | Nebashi et al. |
| 6,677,252 B2 | 1/2004 | Marsh |
| 6,696,157 B1 | 2/2004 | David et al. |
| 6,696,220 B2 | 2/2004 | Bailey et al. |
| 6,703,190 B2 | 3/2004 | Elian et al. |
| 6,713,238 B1 | 3/2004 | Chou et al. |
| 6,719,915 B2 | 4/2004 | Willson et al. |
| 6,730,256 B1 | 5/2004 | Bloomstein et al. |
| 6,743,713 B2 | 6/2004 | Mukherjee-Roy et al. |
| 6,753,972 B1 | 6/2004 | Hirose et al. |
| 6,767,983 B1 | 7/2004 | Fujiyama et al. |
| 6,776,094 B1 | 8/2004 | Whitesides et al. |
| 6,777,170 B1 | 8/2004 | Bloomstein et al. |
| 2001/0023829 A1 | 9/2001 | Olsson et al. |
| 2001/0040145 A1 | 11/2001 | Wilson et al. |
| 2002/0069525 A1 | 6/2002 | Hada et al. |
| 2002/0093122 A1 | 7/2002 | Choi et al. |
| 2002/0094496 A1 | 7/2002 | Choi et al. |
| 2002/0098426 A1 | 7/2002 | Sreenivasan et al. |
| 2002/0132482 A1 | 9/2002 | Chou |
| 2002/0150398 A1 | 10/2002 | Choi et al. |
| 2002/0167117 A1 | 11/2002 | Chou |
| 2003/0080471 A1 | 5/2003 | Chou |
| 2003/0081193 A1 | 5/2003 | White et al. |
| 2003/0092261 A1 | 5/2003 | Kondo et al. |
| 2003/0113638 A1 | 6/2003 | Mancini et al. |
| 2003/0129542 A1 | 7/2003 | Shih et al. |
| 2003/0133126 A1 | 7/2003 | Sarfaty et al. |
| 2003/0205657 A1 | 11/2003 | Voisin |
| 2003/0205658 A1 | 11/2003 | Voisin |
| 2003/0215577 A1 | 11/2003 | Willson et al. |
| 2003/0235787 A1 | 12/2003 | Watts et al. |
| 2004/0007799 A1 | 1/2004 | Choi et al. |
| 2004/0008334 A1 | 1/2004 | Sreenivasan et al. |
| 2004/0009673 A1 | 1/2004 | Sreenivasan et al. |
| 2004/0010341 A1 | 1/2004 | Watts et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0038552 A1 | 2/2004 | Watts et al. |
| 2004/0046271 A1 | 3/2004 | Watts |
| 2004/0089979 A1 | 5/2004 | Rubin |
| 2004/0124566 A1 | 7/2004 | Sreenivasan et al. |
| 2004/0150129 A1 | 8/2004 | Hougham et al. |

FOREIGN PATENT DOCUMENTS

| | | | |
|---|---|---|---|
| EP | | 0867775 A2 | 9/1998 |
| JP | | 55-88332 A | 7/1980 |

| | | |
|---|---|---|
| JP | 57-7931 A | 1/1982 |
| JP | 58-129074 A | 8/1983 |
| JP | 63-138730 A | 6/1988 |
| JP | 1-196749 A | 8/1989 |
| JP | 02-24848 A | 1/1990 |
| JP | 02-92603 A | 4/1990 |
| JP | 02192045 A | 7/1990 |
| JP | 4-70379 A | 5/1992 |
| WO | WO 87/02935 A1 | 5/1987 |
| WO | WO 92/17883 A1 | 10/1992 |
| WO | WO 98/10121 A1 | 3/1998 |
| WO | WO 99/45753 A1 | 9/1999 |
| WO | WO 99/63535 A1 | 12/1999 |
| WO | WO 00/21689 A1 | 4/2000 |
| WO | WO 00/54107 A1 | 9/2000 |
| WO | WO 01/33232 A3 | 5/2001 |
| WO | WO 01/33300 A2 | 5/2001 |
| WO | WO 01/47003 A2 | 6/2001 |
| WO | WO 01/53889 A1 | 7/2001 |
| WO | WO 01/63361 A1 | 8/2001 |
| WO | WO 01/69317 A1 | 9/2001 |
| WO | WO 01/79589 A1 | 10/2001 |
| WO | WO 01/79591 A1 | 10/2001 |
| WO | WO 01/79592 A1 | 10/2001 |
| WO | WO 01/79933 A1 | 10/2001 |
| WO | WO 01/90816 A1 | 11/2001 |
| WO | WO 02/22916 A1 | 3/2002 |
| WO | WO 02/24977 A1 | 3/2002 |

OTHER PUBLICATIONS

Abstract of Japanese Patent 58–129074, Aug. 01, 1983.

Abstract of Japanese Patent 63–138730, Apr. 14, 2004.

Ananthasuresh et al., "Strategies for Systematic Synthesis of Compliant Mems.", DSC–vol. 55–2, Dynamic Systems and Control: vol. 2, pp. 677–686, Nov. 1, 1994.

Arai et al., "Calibration and Basic Motion of a Micro Hand Module.", IEEE, Jan. 1, 1993, pp. 1660–1665.

Arai et al., "Development of a New Parallel Manipulator with Fixed Linear Actuator.", In Proceedings of Japan/USA Symposium on Flexible Automation, Jan. 1, 1996, vol. 1, ASME, New York, pp. 145–149.

Bender et al., "Fabrication of Nanostructures using a UV–based Imprint Technique.", Microelectronic Engineering 53, Jan. 1, 2000, pp. 233–236.

Blomquist et al., "Fluorinated Acrylates in making Low-Loss, Low–Birefringence, and Single–Mode Optical Waveguides with Exceptional Thermo–Optic Properties.", SPIE Conference on Linear Optical Properties of Waveguides and Fibers, Jul. 1, 1999, vol. 3799, pp. 266–279.

Braeuer et al., "Precise Polymer Micro–Optical Systems.", MRS Bulletin, Jul. 1, 2001, pp. 519–522.

Choi et al., "Design of Orientation Stages of Step and Flash Imprint Lithography.", Precision Engineering, Jan. 1, 2001, pp. 192–199.

Chou et al., "Imprint Lithography with 25–Nanometer Resolution." Science vol. 272, Apr. 5, 1996, pp. 85–87.

Chou et al., "Imprint Lithography with Sub–10 nm Feature Size and High Throughput.", Microelectronic Engineering 35, Jan. 1, 1997, pp. 237–240.

Chou et al., "Imprint of Sub–25 nm Vias and Trenches in Polymers.", Applied Physics Letter, Nov. 20, 1995, 67(21).

Chou et al., "Lithographically–Induced Self–assembly of Periodic Polymer Micropillar Arrays.", J. Vac. Sci. Technol., Nov. 1, 1999, B 17(6), pp. 3197–3202.

Chou, "Nanoimprint Lithography and Lithographically Induced Self–Assembly.", MRS Bulletin, Jul. 1, 2001, pp. 512–517.

Colburn et al., "Step and Flash Imprint Lithography for sub–100 nm Patterning.", Proceedings of SPIE, Jan. 1, 2000, vol. 3997, pp. 453–457.

Cowie, "Polymers: Chemistry and Physics of Modern Materials.", $2^{nd}$ Ed., Jan. 1, 1991, pp. 408–409.

Eldada et al., "Advanced Polymer Systems for Optoelectronic Integrated Circuit Applications.", SPIE, Jan. 1, 1997, vol. 3006, pp. 344–361.

Eldada et al., "Affordable WDM Components: The Polymer Solution.", SPIE, Jan. 1, 1998, vol. 3234, pp. 161–174.

Eldada et al., "Robust Photopolymers for MCM, Board, and Backplane Optical Interconnects.", SPIE, Jan. 1, 1998, vol. 3288, pp. 175–191.

Feynman, "There's Plenty of Room at the Bottom.", Engineering and Science, Caltech, Feb. 1960.

Gokan et al., "Dry Etch Resistance of Organic Materials.", J. Electrochem. Soc.: Solid–State Science and Technology, Jan. 1, 1983, 143–146.

Goldfarb et al., "A Well–Behaved Revolute Flexure Joint for Compliant Mechanism Design.", ASME Journal of Mech. Design, Sep. 1, 1999, vol. 121, No. 3, pp. 424–429.

Goldfarb et al., "Compliant Micromanipulator Design for Scaled Bilateral Telemanipulation of Small–Scale Environments.", ASME International Mechanical Engineering Conference and Exposition, Nov. 1, 1998, DSC–vol. 64, pp. 213–218.

Hashimoto et al., "Design and Characteristics of Parallel Link Compliant Wrist." IEEE, May 1, 1994, Department of Mechanical Engineering, Kagoshiam University, pp. 2457–2462.

Heidari, "Nanoimprint Lithography at the 6 in. Wafer Scale.", J. Vac. Sci. Technol. B 18 (6), Nov. 1, 2000, pp. 3557–3560.

Hexapods, "G1000–PS Power Series", www.hexapods.com., Oct. 12, 1999.

Hexel Corporation, "Tornado 2000 System Specifications.", www.hexel.com, Nov. 12, 1999.

Hirai et al., "Abstract of Mold Surface Treatment for Imprint Lithography", Journal of Photopolymer Science and Technology, Aug. 28, 2001, pp. 457–462, vol. 14, No. 3.

Hirai et al., "Mold Surface Treatment for Imprint Lithography.", Journal of Photopolymer Science and Technology, Aug. 1, 2001, vol. 14, No. 3, pp. 457–462.

Hogan et al., "Impedance Control: An Approach to Manipulation: Part 1– Theory. ", Journal of Dynamic Systems, Measurement, and Control, Mar. 1, 1985, vol. 107, pp. 1–7.

Hollis et al., "A Six–Degree–of–Freedom Magnetically Levitated Variable Compliance Fine Motion Wrist: Design, Modeling and Control.", IEEE Transactions on Robotics and Automation, Jun. 1, 1991, vol. 7., No. 3, pp. 320–332.

Howell et al., "Loop–Closure Theory for the Analysis and Synthesis of Compliant Mechanisms.", Journal of Mechanical Design, Mar. 1, 1996, vol. 188, pp. 121–125.

Hu et al., "Fluorescence Probe Techniques (FTP) for Measuring the Relative Efficiencies of Free–Radical Photoinitiators.", Macromolecules, May 29, 1998, 31, pp. 4107–4113.

International Search Report for PCT/US 00/30041, Oct. 18, 2001.

Kanetomo et al., "Robot for Use in Ultrahigh Vacuum.", Solid State Technology, Aug. 1, 1997, pp. 63–72.

Kim et al., "High Precision Magnetic Levitation Stage for Photolithography.", Precision Engineering, Apr. 1, 1998, vol. 22., No. 2, pp. 66–77.

Kim et al., "Surface Energy and Polarity of Treated Indium–Tin–Oxide Anodes for Polymer Light–Emitting Diodes Studied by Contact Angle Measurements.", Journal of Applied Physics, 1999, pp. 2774–2778, vol. 86, No. 5.

Koseki et al., "Design and Accuracy Evaluation of High-Speed and High–Precision Parallel Mechanism.", Proc. Of IEEE, Jan. 1, 1998, Intl. Conf. on Robotics & Automation, pp. 1340–1345.

Kotachi et al., "Si–Containing Positive Resist for ArF Laser Lithography.", Photopolymer Science and Technology, Nov. 4, 1995, pp. 615–622.

Krauss et al., "Fabrication of Nanodevices Using Sub–25nm Imprint Lithography.",Appl. Phys. Lett., Jan. 1, 1995, 67 (21), pp. 3114–3116.

Krug et al., "Fine Patterning of Thin Sol–gel Films.", Journal of Non–Crystalline Solids, Jan. 1, 1992, 147 & 148. pp. 447–450.

Kumar et al., "Features of Gold Having Micrometer to Centimeter Dimensions can be Formed Through a Combination of Stamping with an Elastomeric Stamp and an Alkanethiol "Ink" by Chemical Etching.", Applied Physics Letters, Oct. 4, 1993, vol. 63, Issue 14, pp. 2002–2004.

Lee et al., "An Ultraprecision Stage for Alignment of Wafers in Advanced Microlithography.", Precision Engineering, Sep. 1, 1997, pp. 113–122.

Lee et al., "Ultra Precision Positioning System for Servo Motor–piezo Actuator Using the Dual Servo Loop and Digital Filter Implementation.", American Society for Precision Engineering, Jan. 1, 1998, pp. 287–290.

Lin, "Multi–Layer Resist Systems,", Introduction to Microlithography, Feb. 14, 1983, pp. 287–349.

Lucas Aerospace, Free–Flex ® Pivot Catalog, Jan. 1, 1999.

Luurtsema, "Spin Coating for Rectangular Substrates.", Retrieved May 23, 2002 from URL: http://buffy.eecs.berkelye.edu/IRO/Summary/97abstracts/gluurts.2.html, May 23, 1992.

Mansky et al., "Large–Area Domain Alignment in Block Copolymer Thin Films Using Electric Fields.", Macromolecules, Jun. 9, 1998, vol. 31, No. 13, pp. 4399–4401.

Merlet, "Parallel Manipulators: State of the Art Perspectives.", Advanced Robotics, Jan. 1, 1994, vol. 8, pp. 589–596.

Mirkin et al., "Emerging Methods for Micro–and Nanofabrication.", MRS Bulletin, Jul. 1, 2001, pp. 506–509.

Mitsui et al., "Application of Two–Wavelength Optical Heterodyne Alignment System in XS–1.", Part of the SPIE Conference on Emergine Lithographic Technologies III, Mar. 1, 1999, SPIE vol. 3676, pp. 455–464.

Mittal, "Precision Motion Control of Magnetic Suspension Actuator Using a Robust Nonlinear Compensation Scheme.", IEEE/ASME Transactions on Mechatronics., Dec. 1, 1997, vol. 2., No. 4, pp. 268–280.

NERAC.COM Retro Search, "Imprint Lithography." Oct. 16, 2004.

NERAC.COM Retro Search, "Multi–Layer Resists.", Sep. 2, 2004.

NERAC.COM Retro Search, "Reduction of Dimension of Contact Holes.", Aug. 31, 2004.

NERAC.COM Retro Search, "Trim Etching of Features Formed on an Organic Layer.", Sep. 2, 2004

Nguyen, "Asymmetric Fluid–Structure Dynamics in Nanoscale Imprint Lithography." The University of Texas at Austin, Aug. 1, 2001, pp. 1–111.

Ohya et al., "Development of 3–DOF Finger Module for Micro Manipulation.", Proc. of IEEE, Mar. 1, 1999, Intl. Conf. on Intelligent Robots and Systems, pp. 894–899.

Otto et al., "Characterization and Application of a UV–based Imprint Technique.", Microelectronic Engineering 57–58, Jan. 1, 2001, pp. 361–366.

Papirer et al., "Abstract of The Grafting of Perfluorinated Silanes onto the Surface of Silica: Characterization by Inverse Gas Chromatography.", Journal of Colloid and Interface Science 159, Aug. 1, 1993, pp. 238–242.

Parikh et al., "An Intrinsic Relationship between Molecular Structure in Self–Assembled n–Alkylsiloxane Monolayers and Deposition Temperature.", Journal of Phys. Chem., Jul. 1, 1994, pp. 7577–7590.

Paros et al., "How to design Flexure Hinges.", Machine Design, Nov. 25, 1965, pp. 151–156.

Peng et al., "Compliant Motion Control Kinematically Redundant Manipulators.", IEEE Transactions on Robotics and Automation, Dec. 1, 1993, vol. 9, No. 6, pp. 831–837.

Pernette et al., "Design of Parallel Robots in Microrobotics.", Robotica, Jan. 1, 1997, vol. 15, pp. 417–420.

Physik Instruments, "Hexapod Six–Axis Parallel Kinematics Robot", Nano Positioning, Jan. 1, 1998, pp. 8.4–8.5.

Physik Instruments, "NanoPositioning, MicroPositioning, Piezo Technology.", PI Online Catalog, Jan. 1, 1999, www.physikinstrements.com.

Physik Instrument, "Product Catalog for Micropositioning", 1997.

"Photoresist Coating Methods.", E–mail from Susan Bagen (BAGEN@aol.com) to Dhaval Shah, Sep. 18, 1997.

Raibert et al., "Hybrid Position/Force Control of Manipulators.", Journal of Dynamic Systems, Measurement, and Control, Jun. 1, 1981, vol. 102, pp. 126–133.

Rong et al., "Design and Analysis of Flexure–Hinge Mechanism Used in Micro–Positioning Stages.", ASME, Jan. 1, 1994, vol. 2, pp. 979–985.

Rong et al., "Dynamics of Parallel Mechanism with Direct Compliance Control.", IEEE, Jan. 1, 1997, pp. 1753–1758.

Roos et al., "Abstract of Nanoimprint Lithography with a Commercial 4 Inch Bond System for Hot Embossing", Proceedings of SPIE, Oct. 1, 2001, vol. 4343, pp. 427–435.

Roos et al., "Nanoimprint Lithography with a Commercial 4 Inch Bond System for Hot Embossing.", Proceedings of SPIE, Oct. 1, 2001, vol. 4343, pp. 427–435.

Sagiv, "Organized Monolayers by Absorption. 1. Formation and Structure of Oleophobic Mixed Monolayers on Solid Surfaces.", Journal of American Chemical Society/102:1, Jan. 2, 1980.

Slocum, "Precision Machine Design: Macromachine Design Philosophy and its Applicability to the Design of Micromachines.", Micro Electro Mechanical Systems, Feb. 4, 1992.

Srinivasan et al., "Alkyltrichlorosilane–Based Self–Assembled Monolayer Films for Stiction Reduction in Silicon Micromachines.", Journal of Microelectromechanical Systems, Jun. 1, 1998, vol. 7, No. 2, pp. 252–260.

Stewart, "A Platform With Six Degrees of Freedom.", Proc Instn Mech Engrs, May 28, 1965, vol. 180, Pt1, No. 15, pp. 371–378.

Stix, "Getting More from Moores", Scientific American, Apr. 2001.

Tajbakhsh et al., "Three–Degree–of–Freedom Optic Mount for Extreme Ultraviolet.", American Society for Precision Engineering, Jan. 1, 1998, pp. 359–362.

Tanikawa et al., "Development of Small–sized 3 DOF Finger Module in Micro Hand for Micro Manipulation.", Proc. of IEEE, Mar. 1, 1999, Intl. Conf. on Intelligent Robots and Systems, pp. 876–881.

Translation of Japanese Patent 02–24848, Jan. 26, 1990.

Translation of Japanese Patent 02–92603, Apr. 3, 1990.

Trilogy Systems, "Linear Motors 310.", www.trilogysystems.com, Jan. 1, 2001.

Uchida et al., "A Mask–to–Wafer Alignment and Gap Setting Method for X–ray Lithography Using Graftings.", Journal Vacuum Science Technology, Nov. 1, 1991, B 9 (6), pp. 3202–3206.

U.S. Appl. No. 09/698,371, filed Oct. 27, 2000, Choi et al., "High Precision Orientation Alignment and Gap Control Stages for Imprint Lithography Processes".

Wang et al., "Passive Compliance Versus Active Compliance in Robot–Based Automated Assembly Systems.", Industrial Robot, Jan. 1, 1998, vol. 25, No. 1, pp. 48–57.

White et al., "Novel Alignment System for Imprint Lithography.", J. Vac. Sci. Technol. B 18(6), Nov. 1, 2000, pp. 3552–3556.

Williams et al., "Six Degree of Freedom Mag–Lev Stage Development.", SPIE, Jan. 1, 1997, vol. 3051, pp. 856–867.

Wu, "Large Area High Density Quantized Magnetic Disks Fabricated Using Nanoimprint Lithography,", J. Vac. Sci. Technol., Nov. 1, 1998, B 16(6), pp. 3825–3829.

Xia et al., "Soft Lithography.", Agnew. Chem. Int. Ed., Jan. 1, 1998, pp. 551–575.

Xia et al., "Soft Lithography.", Annu. Rev. Mater. Sci., 1998, 28: 153–184.

Haisma et al., "Mold–Assisted Nanolithography: A Process for Reliable Pattern Replication," Journal of Vacuum Science and Technology, Nov./Dec. 1996, pp. 4124–4128, vol. B 14(6).

Feldman et al., "Wafer chuck for magnification correction in x–ray lithography," American Vacuum Society, 1998, pp. 3476–3479.

Scheer et al., "Problems of the Nanoimprinting Technique for Nanometer Scale Pattern Definition," Journal of Vacuum Science and Technology, Nov./Dec. 1998, pp. 3917–3921, vol. B 16(6).

Colburn. et al., "Step and Flash Imprint Lithography: A New Approach to High–Resolution Patterning", Proc. of SPIE, 1999, pp. 379–389, vol. 3676.

Ruchhoeft et al., "Patterning Curved Surfaces: Template Generation by Ion Beam Proximity Lithography and Relief Transfer by Step and Flash Imprint Lithography," Journal of Vacuum Science and Technology, 1999, pp. 2965–2982, vol. 17.

Bailey et al., "Template for Room Temperature Low Pressure Micro– and Nano–Imprint Lithography," U.S. Appl. No. 09/976,681, Filed with USPTO on Oct. 12, 2001.

Voisin, "Methods on Manufacturing a Lithography Template," U.S. Appl. No. 10/136,188, Filed with USPTO on May 1, 2002.

Willson et al., "Method and System for Fabricating Nanoscale Patterns in Light Curable Compositions Using an Electric Field," U.S. Appl. No. 09/905,718, Filed with USPTO on May 16, 2002.

Sreenivasan et al., "Step and Repeat Imprint Lithography Systems," U.S. Appl. No. 10/194,414, Filed with USPTO Jul. 11, 2002.

Sreenivasan et al., "Step and Repeat Imprint Lithography Processes," U.S. Appl. No. 10/194,991, Filed with USPTO Jul. 11, 2002.

Watts et al., "Scatterometry Alignment for Imprint Lithography," U.S. Appl. No. 10/210,785, Filed with USPTO Aug. 1, 2002.

Sreenivasan et al., "Alignment Systems for Imprint Lithography," U.S. Appl. No. 10/201,894, Filed with USPTO Aug. 1, 2002.

* cited by examiner

METHOD OF REDUCING PATTERN DISTORTIONS DURING IMPRINT LITHOGRAPHY PROCESSES

The field of invention relates generally to imprint lithography. More particularly, the present invention is directed to reducing pattern distortions during imprint lithography processes.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The transfer layer and the solidified polymeric material are subjected to an environment to selectively etch the transfer layer relative to the solidified polymeric material such that a relief image is formed in the transfer layer. The time required and the minimum feature dimension provided by this technique is dependent upon, inter alia, the composition of the polymerizable material.

U.S. Pat. No. 5,772,905 to Chou discloses a lithographic method and apparatus for creating ultra-fine (sub-25 nm) patterns in a thin film coated on a substrate in which a mold having at least one protruding feature is pressed into a thin film carried on a substrate. The protruding feature in the mold creates a recess of the thin film. The mold is removed from the film. The thin film then is processed such that the thin film in the recess is removed exposing the underlying substrate. Thus, patterns in the mold are replaced in the thin film, completing the lithography. The patterns in the thin film will be, in subsequent processes, reproduced in the substrate or in another material which is added onto the substrate.

Yet another imprint lithography technique is disclosed by Chou et al. in *Ultrafast and Direct Imprint of Nanostructures in Silicon,* Nature, Col. 417, pp. 835–837, June 2002, which is referred to as a laser assisted direct imprinting (LADI) process. In this process a region of a substrate is made flowable, e.g., liquefied, by heating the region with the laser. After the region has reached a desired viscosity, a mold, having a pattern thereon, is placed in contact with the region. The flowable region conforms to the profile of the pattern and is then cooled, solidifying the pattern into the substrate. A concern with these processes concerns distortions in the pattern resulting from, inter alia, extenuative variations in the imprinting layer and/or the substrate.

It is desired, therefore, to provide a method to reduce distortions in patterns formed using imprint lithographic techniques.

SUMMARY OF THE INVENTION

The present invention is directed to a method of reducing distortions in a pattern disposed on a layer of a substrate, defining a recorded pattern, employing a mold having the pattern recorded therein, defining an original pattern. The method includes, defining a region on the layer in which to produce the recorded pattern. Relative extenuative variations between the substrate and the mold are created to ensure that the original pattern defines an area coextensive with the region. Thereafter, the recorded pattern is formed in the region. The relative extenuative variations are created by heating or cooling of the substrate so that the region defines an area that is slightly smaller than the area of the original pattern. Then compression forces are applied to the mold to provide the recorded pattern with an area coextensive with the area of the region. Alternatively, the substrate may define an area slightly larger than the area of the region, and tensile forces are applied to the mold to make the area of the mold coextensive with the area of the region. The dimensions of the region and the recorded pattern are determined by analyzing fiducial marks in the region and alignment marks on the mold. These and other embodiments are described more fully below.

DETAILED DESCRIPTION OF THE INVENTION

Figure 1:
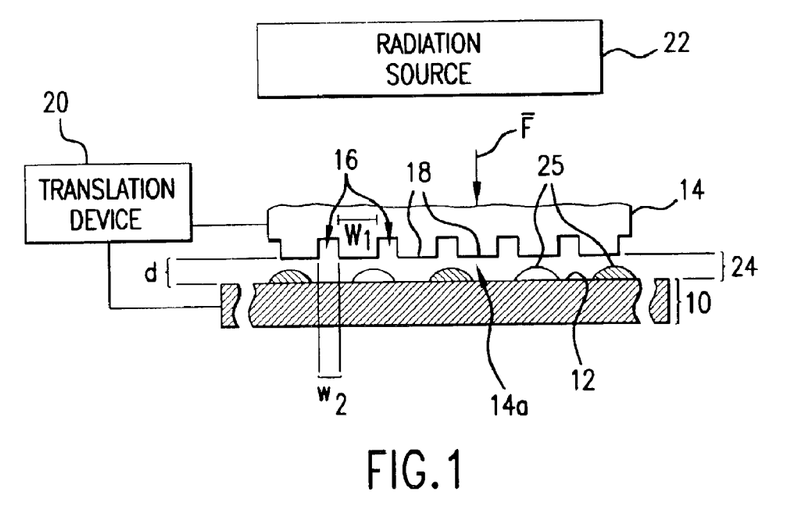
FIG. 1 is a simplified elevation view of a lithographic system in accordance with the present invention.

Referring to FIG. 1, a lithographic system in accordance with an embodiment of the present invention includes a substrate 10 having a substantially planar region shown as surface 12. Disposed opposite substrate 10 is an imprint device, such as a mold 14, having a plurality of features thereon, forming a plurality of spaced-apart recessions 16 and protrusions 18. The plurality of features defines an original pattern that is to be transferred into substrate 10. In the present embodiment, recessions 16 are a plurality of grooves extending along a direction parallel to protrusions 18 that provide a cross-section of mold 14 with a shape of a battlement. However, recessions 16 may correspond to virtually any feature required to create an integrated circuit. A translation device 20 is connected between mold 14 and substrate 10 to vary a distance "d" between mold 14 and substrate 10. A radiation source 22 is located so that mold 14 is positioned between radiation source 22 and substrate 10. Radiation source 22 is configured to impinge actinic radiation on substrate 10. To realize this, mold 14 is fabricated from material that allows it to be substantially transparent to the actinic radiation produced by radiation source 22.

Figure 2:
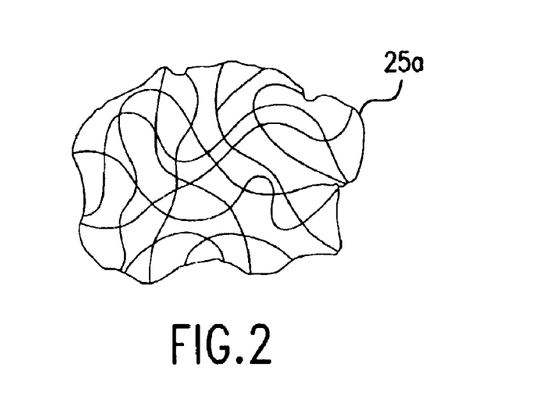
FIG. 2 is a simplified representation of material from which an imprinting layer, shown in FIG. 1, is comprised before being polymerized and cross-linked.

Referring to both FIGS. 1 and 2, a flowable region, such as an imprinting layer 24, is disposed on surface 12. Flowable region may be formed using any known technique such as a hot embossing process disclosed in U.S. Pat. No. 5,772,905, which is incorporated by reference in its entirety herein, or a laser assisted direct imprinting (LADI) process of the type described by Chou et al. in *Ultrafast and Direct Imprint of Nanostructures in Silicon,* Nature, Col. 417, pp. 835–837, June 2002. In the present embodiment, however, flowable region consists of imprinting layer 24 being deposited as a plurality of spaced-apart discrete beads 25 of material 25a on substrate 10, discussed more fully below. Imprinting layer 24 is formed from a material 25a that may be selectively polymerized and cross-linked to record the original pattern therein, defining a recorded pattern. Material 25a is shown in FIG. 3 as being cross-linked at points 25b, forming cross-linked polymer material 25c.

Figure 4:
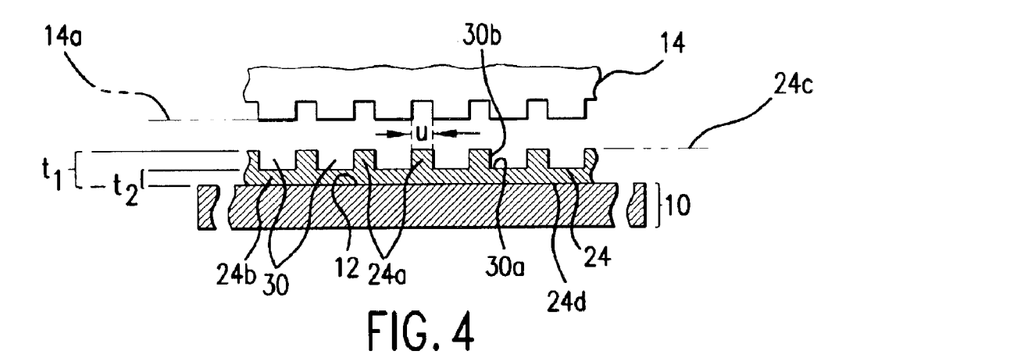
FIG. 4 is a simplified elevation view of a mold spaced-apart from the imprinting layer, shown in FIG. 1, after patterning of the imprinting layer.

Referring to FIGS. 1, 2 and 4, the pattern recorded in imprinting layer 24 is produced, in part, by mechanical contact with mold 14. To that end, translation device 20 reduces the distance "d" to allow imprinting layer 24 to come into mechanical contact with mold 14, spreading beads 25 so as to form imprinting layer 24 with a contiguous formation of material 25a over surface 12. In one embodiment, distance "d" is reduced to allow sub-portions 24a of imprinting layer 24 to ingress into and fill recessions 16.

To facilitate filling of recessions 16, material 25a is provided with the requisite properties to completely fill recessions 16 while covering surface 12 with a contiguous formation of material 25a. In the present embodiment, sub-portions 24a of imprinting layer 24 in superimposition with protrusions 18 remain after the desired, usually minimum distance "d", has been reached, leaving sub-portions 24a with a thickness $t_1$, and sub-portions 24b with a thickness, $t_2$. Thicknesses "$t_1$" and "$t_2$" may be any thickness desired, dependent upon the application. Typically, $t_1$ is selected so as to be no greater than twice the width u of sub-portions 24a, i.e., $t_1 \leq 2u$, shown more clearly in FIG. 4.

Figure 3:
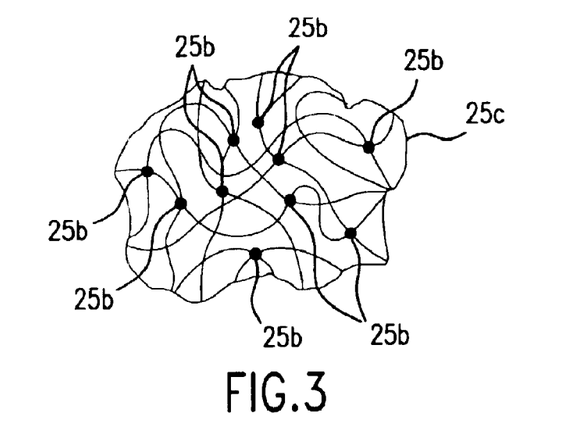
FIG. 3 is a simplified representation of cross-linked polymer material into which the material shown in FIG. 2 is transformed after being subjected to radiation.

Referring to FIGS. 1, 2 and 3, after a desired distance "d" has been reached, radiation source 22 produces actinic radiation that polymerizes and cross-links material 25a, forming cross-linked polymer material 25c. As a result, the composition of imprinting layer 24 transforms from material 25a to material 25c, which is a solid. Specifically, material 25c is solidified to provide side 24c of imprinting layer 24 with a shape conforming to a shape of a surface 14a of mold 14, shown more clearly in FIG. 4.

Referring again to FIGS. 1, 2 and 3 an exemplary radiation source 22 may produce ultraviolet radiation. Other radiation sources may be employed, such as thermal, electromagnetic and the like. The selection of radiation employed to initiate the polymerization of the material in imprinting layer 24 is known to one skilled in the art and typically depends on the specific application which is desired. After imprinting layer 24 is transformed to consist of material 25c, translation device 20 increases the distance "d" so that mold 14 and imprinting layer 24 are spaced-apart.

Referring to FIG. 4, additional processing may be employed to complete the patterning of substrate 10. For example, substrate 10 and imprinting layer 24 may be etched to transfer the pattern on imprinting layer 24 into substrate 10. To facilitate etching, the material from which imprinting layer 24 is formed may be varied to define a relative etch rate with respect to substrate 10, as desired. The relative etch rate of imprinting layer 24 to substrate 10 may be in a range of about 1.5:1 to about 100:1. Alternatively, or in addition to, imprinting layer 24 may be provided with an etch differential with respect to photo-resist material (not shown) selectively disposed on side 24c. The photo-resist material (not shown) may be provided to further pattern imprinting layer 24, using known techniques. Any etch process may be employed, dependent upon the etch rate desired and the underlying constituents that form substrate 10 and imprinting layer 24. Exemplary etch processes may include plasma etching, reactive ion etching, chemical wet etching and the like.

Figure 5:
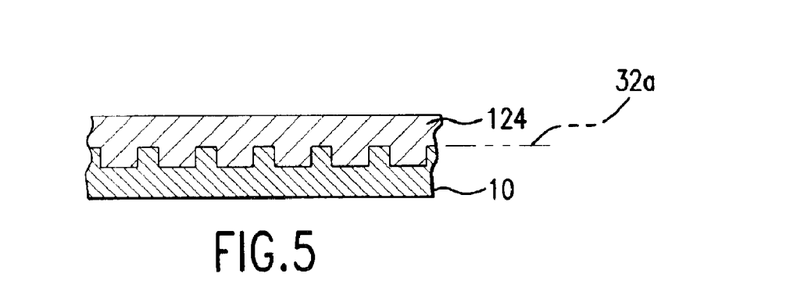
FIG. 5 is a simplified elevation view of an additional imprinting layer positioned atop of the substrate shown in FIG. 4 after the pattern in the first imprinting layer is transferred therein.

Referring to FIGS. 4 and 5, a problem addressed by the present invention concerns distortions in the pattern recorded into imprinting layer 24 due, inter alia, to extenuative variations of imprinting layer 24 and substrate 10. These extenuative variations may be due, in part, to thermal fluctuations, such as differences in thermal coefficients of expansions between the materials in two or more layers; errors introduced by previous processes, such as, magnification errors, incorrect scanning speed; and errors introduced by environmental changes such as moisture content and barometric pressure changes. The extenuative variations produce what is commonly referred to as magnification/run-out errors. The magnification/run-out errors occur when a region of substrate 10 in which the original pattern is to be recorded exceeds the area of the original pattern. Additionally, magnification/run-out errors occur when the region of substrate 10 in which the original pattern is to be recorded has an area smaller than the original pattern. The deleterious effects of magnification/run-out errors are exacerbated when forming multiple patterns in a common region as shown in FIG. 5 as imprinting layer 124 in superimposition with patterned surface 32a. Proper alignment between two superimposed patterns is difficult in the face of magnification/run-out errors in both single-step full wafer imprinting and step-and-repeat imprinting processes.

Figure 6:
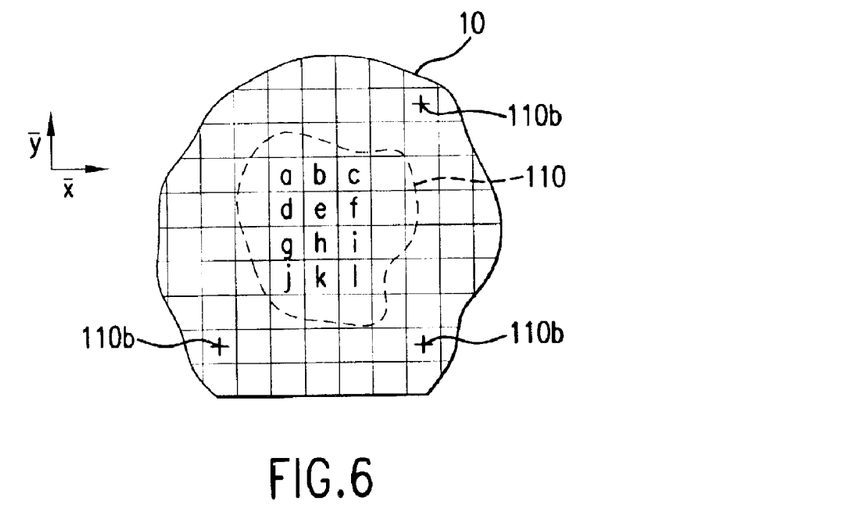
FIG. 6 is a top down view of a substrate, shown in FIGS. 1, 2 and 5, upon which imprinting layers are disposed.
Figure 7:
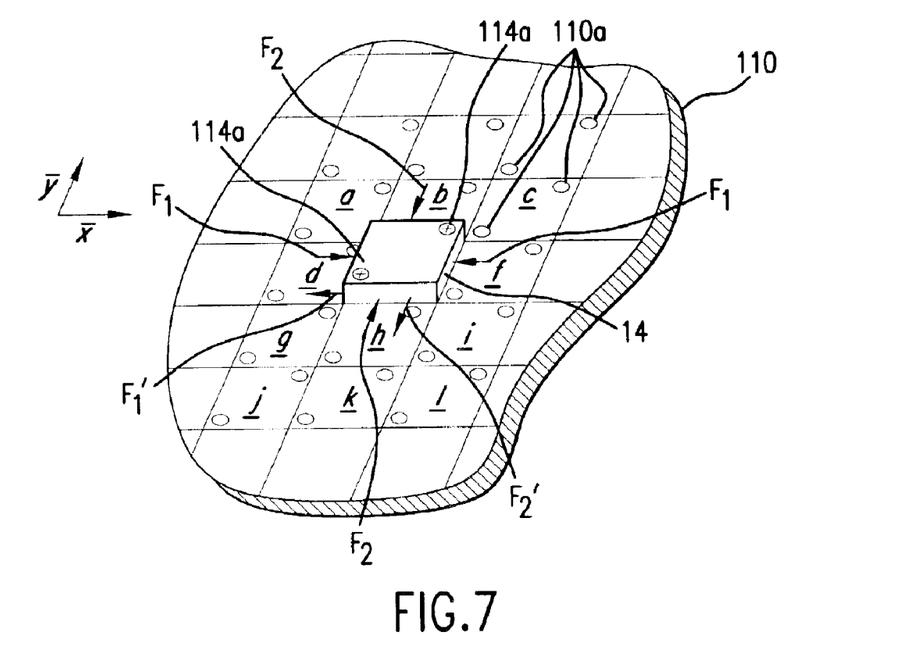
FIG. 7 is a detailed view of FIG. 6 showing the position of the mold in one of the imprint regions.

Referring to FIGS. 6 and 7, a step-and-repeat process includes defining a plurality of regions, shown as, a–l, on substrate 10 in which the original pattern on mold 14 will be recorded. The original pattern on mold 14 may be coextensive with the entire surface of mold 14, or simply located to a sub-portion thereof. The present invention will be discussed with respect to the original pattern being coextensive with the surface of mold 14 that faces substrate 10. Proper execution of a step-and-repeat process may include proper alignment of mold 14 with each of regions a–l. To that end, mold 14 includes alignment marks 114a, shown as a "+" sign. One or more of regions a–l includes fiducial marks 110a. By ensuring that alignment marks 114a are properly aligned with fiducial marks 110a, proper alignment of mold 14 with one of regions a–l in superimposition therewith is ensured. To that end, machine vision devices (not shown) may be employed to sense the relative alignment between alignments marks 114a and fiducial marks 110a. In the present example, proper alignment is indicated upon alignment marks 114a being in superimposition with fiducial marks 110a. With the introduction of magnification/run-out errors, proper alignment becomes very difficult.

However, in accordance with one embodiment of the present invention, area-wise correction of magnification/run-out errors is implemented by creating area-wise relative extenuative variations between mold 14 and substrate 10. For example the temperature of substrate 10 is varied so that one of regions a–l defines an area that is slightly less/greater than an area of the original pattern on mold 14. Thereafter, the final compensation for magnification/run-out errors is achieved by subjecting mold 14 to mechanical compression forces, shown by arrows $F_1$ and $F_2$, orientated transversely to one another. One or more compression forces $F_1$ and $F_2$ may be applied were the area of one of regions a–l slightly less than the area of the original pattern. Were the area of original pattern slightly less than the area of one of regions a–l, one or more tensile forces $F_1'$ and $F_2'$ may be be applied to mold 14 to stretch the same so that the original pattern is coextensive with one of regions a–l. Each of these techniques establishes the original pattern to be coextensive with the area of the region a–l in superimposition therewith.

It is also possible to correct magnification/run-out errors employing single dimensional, or multi-single dimensional correction techniques. In one example of a multi-single dimensional correction technique the temperature of substrate 10 is varied so that the distance along first and second directions that one of regions a–l extends changes. This may result in the distance that the one of regions a–l extends along a first direction, e.g., along the X-axis, being less than the distance that the original pattern on mold 14 extends. The distance that one of the regions a–l extends along a second direction, e.g., along the Y-axis may be coextensive with the distance that the original pattern on mold 14 extends along the second direction. As a result, only one of compression force, $F_1$, need be applied to mold 14 to properly scale the original pattern on mold 14 to be coextensive with one of the regions a–l. This is particularly useful when employing a substrate formed from material that reacts anisotropically to thermal fluctuations. Were it found that the distance that one of the regions a–l extends along the second direction was greater than the distance that the original pattern extends on mold 14, tensile force $F_2'$ would be applied to mold 14, along with compression force $F_1$, to properly scale the original pattern with one of the regions a–l. As a result, the variations in the original pattern in mold 14 and substrate 10 are performed independent of the area defined by each.

Figure 8:
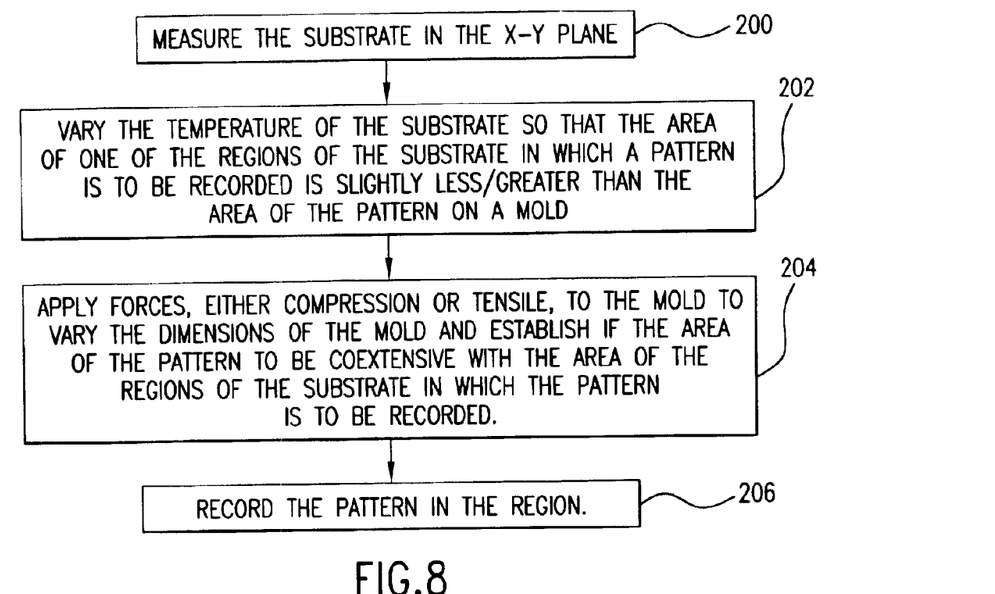
FIG. 8 is a flow diagram showing a method of reducing distortions in patterns formed using imprint lithography techniques in accordance with one embodiment of the present invention.

Referring to FIGS. 6, 7 and 8, in an exemplary operation, an accurate measurement of substrate 10 in an X-Y plane is undertaken at step 200. This may be achieved by sensing gross alignment fiducials 110b present on substrate 10 using machine vision devices (not shown) and known signal processing techniques. At step 202, the temperature of substrate 10 may be varied, i.e., raised or lowered, so that the area of one of regions a–l is slightly less/greater than an area of the original pattern on mold 14. The temperature variations may be achieved using a temperature controlled chuck or pedestal (not shown) against which substrate 10 rests. The area of each of regions a–l can be determined by measurement of a change in distance between two collinear gross alignment fiducials 110b.

Specifically, a change in the distance between two gross alignment fiducials 110b collinear along one of the X or Y axes is determined. Thereafter, this change in distance is divided by a number of adjacent regions a–l on the substrate 10 along the X-axis. This provides the extenuative change of the areas of regions a–l attributable to extenuative changes in substrate 10 along the X-axis. If necessary the same measurement may be made to determine the change in area of regions a–l due to extenuative changes of substrate 10 along the Y-axis. However, it may also be assumed that the extenuative changes in substrate 10 may be uniform in the two orthogonal axes X and Y.

At step 204, compression forces, $F_1$ and $F_2$, or tensile force $F_1'$ and $F_2'$, are applied to mold 14 to establish the area of the original pattern to be coextensive with the area of one of the regions a–l in superimposition with the pattern. This may be achieved in real-time employing machine vision devices (not shown) and known signal processing techniques, to determine when two or more of alignment marks 114a are aligned with two or more of fiducial marks 110a, thereby ensuring proper scaling of mold 14 and substrate 10. At step 206, after proper scaling is achieved so that magnification/run-out errors are reduced, if not vitiated, the original pattern is recorded in the region a–l that is in superimposition with mold 14, forming the recorded pattern. It is not necessary that compression forces $F_1$ and $F_2$ have the same magnitude, as the extenuative variations in either substrate 10 or mold 14 may not be uniform in all directions. Further, the magnification/run-out errors may not be identical in both X-Y directions. As a result, compression forces, $F_1$ and $F_2$ may differ to compensate for these anomalies. For similar reasons it is not necessary that tensile forces, $F_1'$ and $F_2'$ have the same magnitude, were these force employed. Furthermore, to ensure greater reduction in magnification/run-out errors, the extenuative variation in mold 14 may be undertaken after mold 14 contacts imprinting layer 124, shown in FIG. 5. However, this is not necessary.

The scaling of mold 14 with region a–l in superimposition therewith may occur with mold 14 being spaced-apart from imprinting layer 124. Were it found that the magnification/run-out error were constant over the entire substrate 10, then the magnitude of forces $F_1$ and $F_2$, or $F_1'$ and $F_2'$ could be maintained for each region a–l in which the original pattern is recorded. However, were it determined that the magnification/run-out error differed for one or more regions a–l, steps 202 and 204 would then be undertaken for each region a–l in which the original pattern is recorded. It should be noted that there are limits to the relative extenuative changes that may occur between substrate 10 and mold 14. For example, the area of the regions a–l should be of appropriate dimensions to enable pattern on mold 14 to define an area coextensive therewith when mold 14 is subject to compression forces $F_1$ and $F_2$, or tensile forces $F_1'$ and $F_2'$, without compromising the structural integrity of mold 14.

Referring to FIGS. 1 and 8, it should be understood that the exemplary method is described based upon the assumption that mold 14 is formed from quartz glass and substrate 10 is formed from silicon. As a result, substrate 10 is provided with a coefficient of thermal expansion (CTE) that is greater than the CTE associated with mold 14. Thus, gross extenuative changes are made with substrate 10, because of the higher CTE associated therewith. Thereafter, fine extenuative changes are made to mold 14 to attenuate, if not remove, magnification/run-out errors. However, were the CTE associated with mold 14 greater than the CTE associated with substrate 10, the method described in FIG. 9 may be employed to correct magnification/run-out errors.

Figure 9:
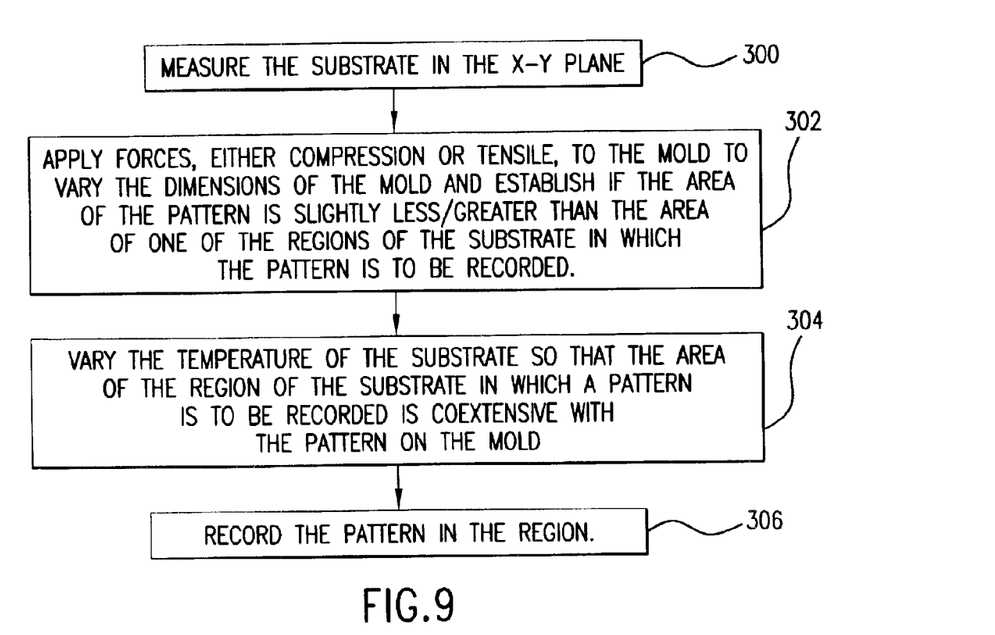
FIG. 9 is a flow diagram showing a method of reducing distortions in patterns formed using imprint lithography techniques in accordance with a second embodiment of the present invention.

Referring to FIGS. 1 and 9, an accurate measurement of substrate 10 in an X-Y plane is undertaken at step 300. At step 302, compression forces, $F_1$ and $F_2$, or tensile forces $F_1'$ and $F_2'$, are applied to mold 14 to establish if the area of the original pattern is to be slightly less/greater than the area of one of the regions a–l in superimposition with the pattern. At step 304, the temperature of substrate 10 may be varied, i.e., raised or lowered, so that the area of one of regions a–l is coextensive with the area of the original pattern on mold 14. The temperature variations may be achieved as discussed above. Similarly, determination of whether the area of the original pattern on mold 14 is coextensive with one of the regions a–l may be determined as discussed above with respect to FIG. 8. Thereafter, at step 306 in FIG. 9, after proper scaling is achieved so that magnification/run-out errors are reduced, if not vitiated, the original pattern is recorded in the region a–l that is in superimposition with mold 14, shown in FIG. 1.

Figure 10:
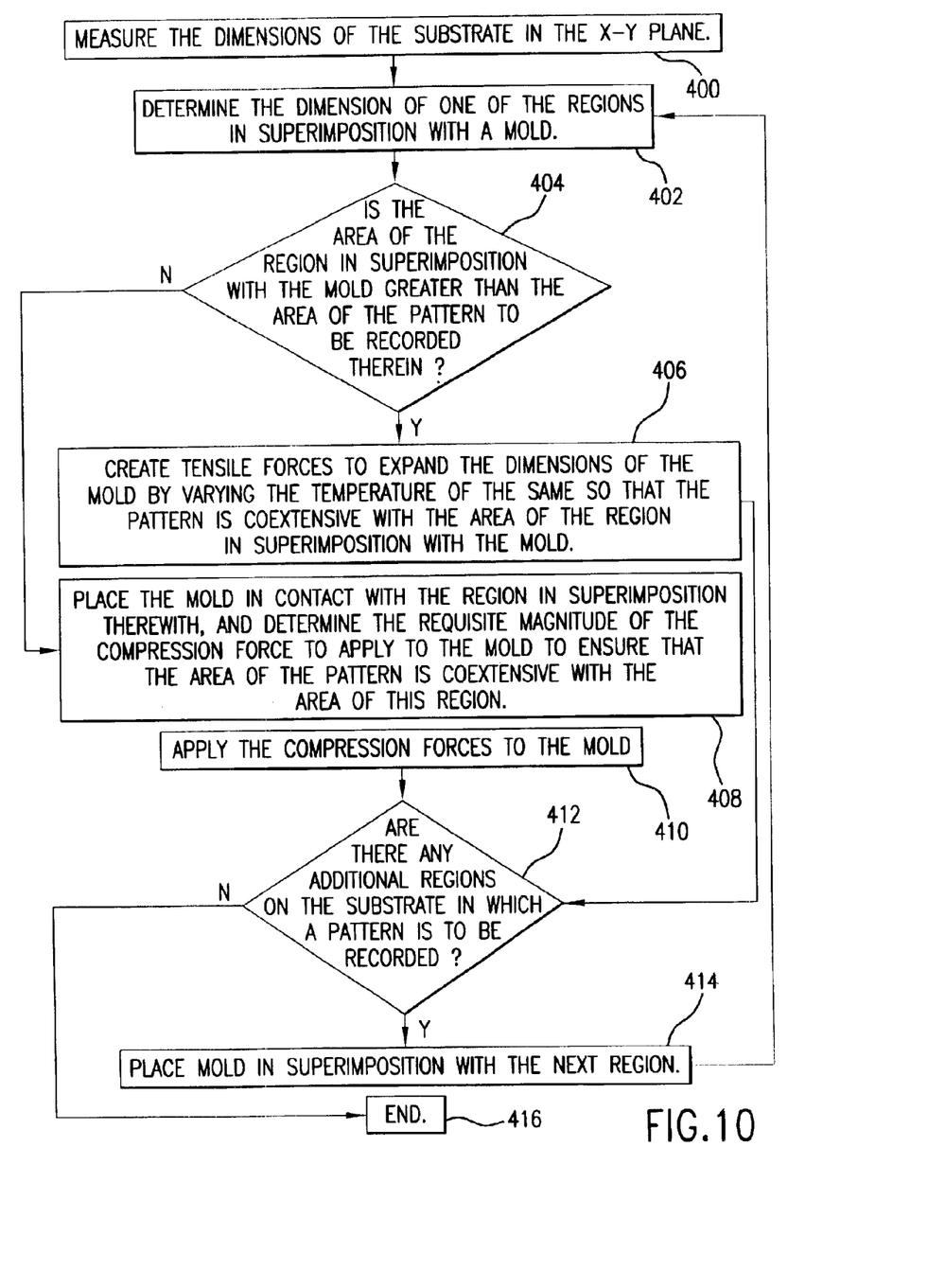
FIG. 10 is a flow diagram showing a method of reducing distortions in patterns formed using imprint lithography techniques in accordance with a third embodiment of the present invention.

Referring to FIGS. 6, 7 and 10, in accordance with another embodiment of the present invention, accurate measurement of substrate 10 in an X-Y plane is undertaken at step 400. At step 402, the dimensions of one of regions a–l in superimposition with mold 14 is determined. This may occur after the dimensions of substrate 10 have been varied, as discussed above. Alternatively, the dimensions of substrate 10 may be left unchanged, because either tensile forces, $F_1'$ and $F_2'$, or compression forces, $F_1$ and $F_2$, may be applied to substrate 10, as necessary to properly scale mold 14 with substrate 10 to attenuate magnification/run-out errors. To that end, at step 404, it is determined whether the area of one of regions a–l in superimposition with mold 14 is larger than the area of pattern on mold 14. If this is the case, the process proceeds to step 406, otherwise the process proceeds to step 408. At step 408, mold 14 is placed in contact with the region a–l in superimposition therewith, and the requisite magnitude of compression forces $F_1$ and $F_2$ is determined to apply to mold 14 to ensure that the area of pattern is coextensive with the area of this region a–l. At step 410, compression forces $F_1$ and $F_2$ are applied to mold 14. Thereafter, mold 14 is spaced-apart from the region a–l in superimposition with mold 14 and the process proceeds to step 412 where it is determined whether there remain any regions a–l on substrate 10 in which to record the original pattern. If there are, the process proceeds to step 414 wherein mold 14 is placed in superimposition with the next region and the process proceeds to step 402. Otherwise, the process ends at step 416.

Were it determined at step 404 that the region a–l in superimposition with mold 14 had an area greater than the area of the pattern, then the process proceeds to step 406 wherein tensile forces $F_1'$ and $F_2'$, are applied to mold 14 causing expansion of the same. In the present embodiment, mold 14 is heated at step 406 so that the pattern is coextensive with the area of region a–l in superimposition therewith. Then the process continues at step 412.

Figure 11:
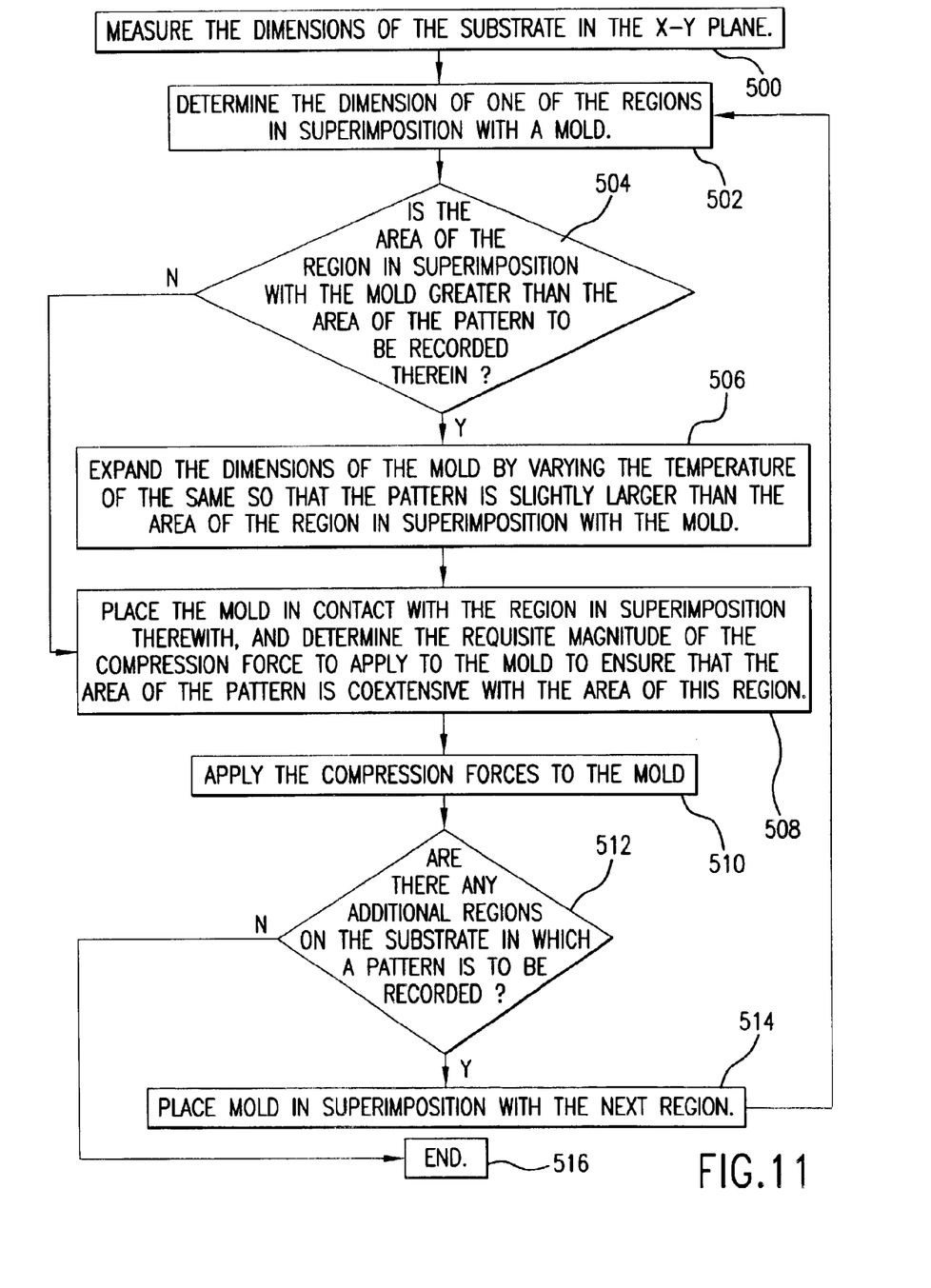
FIG. 11 is a flow diagram showing a method of reducing distortions in patterns formed using imprint lithography techniques in accordance with a fourth embodiment of the present invention.

Referring to FIGS. 6, 7 and 11, in accordance with another embodiment of the present invention, accurate measurement of substrate 10 in an X-Y plane is undertaken at step 500. At step 502, the dimensions of one of regions a–l in superimposition with mold 14 is determined. At step 504 it is determined whether the area of one of regions a–l in superimposition with mold 14 is larger than the area of pattern on mold 14. If this is the case, the process proceeds to step 506, otherwise the process proceeds to step 508. At step 508, mold 14 is placed in contact with the region a–l in superimposition therewith, and the requisite magnitude of compression forces $F_1$ and $F_2$ is determined to apply to mold 14 to ensure that the area of pattern is coextensive with the area of this region a–l. At step 510, compression forces $F_1$ and $F_2$ are applied to mold 14. Thereafter, mold 14 is spaced-apart from the region a–l in superimposition with mold 14 and the process proceeds to step 512 where it is determined whether there remain any regions a–l on substrate 10 in which to record the original pattern. If there are, the process proceeds to step 514 wherein mold 14 is placed in superimposition with the next region and the process proceeds to step 502. Otherwise, the process ends at step 516.

Were it determined at step 504 that the region a–l in superimposition with mold 14 had an area greater than the area of the pattern, then the process proceeds to step 506 wherein the temperature of mold 14 is varied to cause expansion of the same. In the present embodiment, mold 14 is heated at step 506 so that the pattern is slightly larger than the area of region a–l in superimposition therewith. Then the process continues at step 508. In this manner, all of the magnification/run-out error correction may occur by compression of mold, without any need to vary the dimensions of substrate 10. However, the present method may also be employed with extenuative variations to substrate 10, as well.

The embodiments of the present invention described above are exemplary. Many changes and modifications may be made to the disclosure recited above, while remaining within the scope of the invention. For example, as mentioned above, many of the embodiments discussed above may be implemented in existing imprint lithography processes that do not employ formation of an imprinting layer by deposition of beads of polymerizable material. Exemplary processes in which differing embodiments of the present invention may be employed include a hot embossing process disclosed in U.S. Pat. No. 5,772,905, which is incorporated by reference in its entirety herein. Additionally, many of the embodiments of the present invention may be employed using a laser assisted direct imprinting (LADI) process of the type described by Chou et al. in *Ultrafast and Direct Imprint of Nanostructures in Silicon,* Nature, Col. 417, pp. 835–837, June 2002. Therefore, the scope of the invention should be determined not with reference to the above description, but instead should be determined with reference to the appended claims along with their full scope of equivalents.

What is claimed is:

1. A method of reducing distortions in a pattern disposed on a layer of a substrate, defining a recorded pattern, employing a mold having features to form said pattern on said layer, defining an original pattern, said method comprising:

defining a region on said layer in which to produce said recorded pattern;

creating relative extenuative variations between said substrate and said mold by varying a temperature of one of said substrate and said mold so that an area defined by said original pattern differs from said area defined by said region; and applying mechanical stresses to said mold to varying said area associated with said original pattern to be coextensive with said area defined by said region.

2. The method as recited in claim 1 wherein applying mechanical stress further includes applying compression forces to said mold.

3. The method as recited in claim 1 wherein applying mechanical stresses further includes applying tensile stresses to said mold.

4. The method as recited in claim 1 wherein creating extenuative variations further includes varying said temperature of said substrate to vary said area defined by said region to be less than said area defined by said original pattern.

5. The method as recited in claim 1 wherein creating extenuative variations further includes varying said temperature of said substrate to vary said area defined by said region to be greater than said area defined by said original pattern.

6. The method as recited in claim 1 wherein defining said region further includes defining a plurality of regions on said layer in which to produce said recorded pattern, sequentially placing said original pattern in superimposition with each region associated with a subgroup of said plurality of regions and creating relative extenuative variations between said mold and one of the regions of said subgroup in superimposition therewith by varying said temperature of one of said substrate and said mold so that the area defined by said one of the regions differs from an area defined by said original pattern and applying mechanical stresses further includes applying mechanical stresses to said mold to vary said area defined by said original pattern to be coextensive with said area defined by said one of the regions.

7. The method as recited in claim 1 further including depositing a bead of polymerizable material upon said substrate and spreading said bead over said substrate to define said layer, with forming said recorded pattern further including contacting said layer with said mold to create said recorded pattern in said region and subjecting said layer to conditions to polymerize said layer, wherein creating relative extenuative variations in said substrate and said mold occurs after contacting said layer with said mold.

8. The method as recited in claim 1 further including creating a flowable site on said substrate to define said layer, with forming said recorded pattern further including contacting said if lowable site with said mold to create said recorded pattern in said region and subjecting said layer to conditions to solidify said layer, wherein creating relative extenuative variations in said substrate and said mold occurs after contacting said if lowable region with said mold.

9. The method as recited in claim 1 further including forming a plurality of fiducials in said region and providing said mold with a plurality of alignment marks, wherein creating relative extenuative variations further includes superimposing said mold with said region and sensing differences in alignment between said if iducials and said alignments marks.

10. A method of reducing distortions in a pattern disposed on a layer of a substrate, defining a recorded pattern, employing a mold having features to form said pattern on said layer, defining an original pattern, said method comprising:

defining a plurality of regions on said layer in which to produce said recorded pattern by depositing a plurality of beads of polymerizable material upon said substrate, and spreading said plurality of beads over said substrate to define said layer by repeatably superimposing a mold, having a relief structure, with each of said plurality of regions and contacting said plurality of beads with said mold to create a recess and a protrusion;

forming a plurality of fiducials in each of said plurality of regions and providing said mold with a plurality of alignment marks;

creating relative extenuative variations between said substrate and said mold by varying a temperature of one of said substrate and said mold so that an area defined by said original pattern differs from an area defined by said one of said plurality of regions in superimposition therewith;

applying mechanical stresses to said mold to vary said area defined by said original pattern to be coextensive with said area defined by said one of said plurality of regions; and sensing differences in alignment between said fiducials and said alignment marks.

11. The method as recited in claim 10 wherein applying mechanical stress further includes applying, to said mold, forces selected from a set of forces consisting essentially of compression forces and tensile forces.

12. The method as recited in claim 11 further including subjecting said layer to conditions to polymerize said polymerizable material.

13. The method as recited in claim 12 wherein creating extenuative variations further includes varying said temperature of said substrate to vary said area defined by said region to be less than said area defined by said original pattern.

14. The method as recited in claim 13 wherein creating extenuative variations further includes varying said temperature of said substrate to vary said area defined by said region to be greater than said area defined by said original pattern.

15. A method of reducing distortions in a pattern disposed on a layer of a substrate, defining a recorded pattern, employing a mold having features to form said pattern on said layer, defining an original pattern, said method comprising:

defining a region on said layer in which to produce said recorded pattern;

creating relative extenuative variations, in first and second transverse directions, between said substrate and said mold by varying a temperature of one of said substrate and said mold so a distance said original pattern extends along said first direction differs from a distance that said region extends along said first direction; and applying mechanical stress to said mold to vary said distance said original pattern extends along said first direction to be coextensive with said distance said region extends along said first direction.

16. The method as recited in claim 15 wherein creating relative extenuative variations further includes varying said temperature of one of said substrate and said mold so a distance said original pattern extends along said second direction differs from a distance said region extends along said second direction and applying mechanical stress further includes varying said distance said original pattern extends along said second direction to be coextensive with said distance said region extends along said second direction.

17. The method as recited in claim 15 wherein applying mechanical stress further includes applying compression forces to said mold to vary said distance said original pattern extends along said first and second transverse directions.

18. The method as recited in claim 15 wherein applying mechanical stresses further includes applying tensile stresses to said mold to vary said distance said original pattern extends along said first and second transverse directions.

19. The method as recited in claim 15 wherein creating extenuative variations further includes varying said temperature of said substrate to vary said distance along said first direction said region extends to be less than said distance along said first direction said original pattern extends.

20. The method as recited in claim 15 wherein creating extenuative variations further includes varying said temperature of said substrate to vary said distance along said first direction said region extends to be greater than said distance along said first direction said original pattern extends.

* * * * *